United States Patent [19]

Lindsay et al.

[11] 4,395,313

[45] Jul. 26, 1983

[54] VACUUM PRETREATMENT PROCESS FOR DURABLE ELECTROPLATED COATINGS ON ABS AND PPO PLASTICS

[75] Inventors: James H. Lindsay, Fenton; Joseph La Sala, St. Clair Shores, both of Mich.; Hamid M. Ghorashi, Midlothian, Va.

[73] Assignee: General Motors Corporation, Detroit, Mich.

[21] Appl. No.: 402,899

[22] Filed: Jul. 29, 1982

[51] Int. Cl.³ .............................................. C25D 5/54
[52] U.S. Cl. .................................. 204/30; 204/32 R; 204/38 B; 204/38 R; 204/192 E; 427/250
[58] Field of Search ............... 427/250; 204/30, 32 R, 204/38 B, 38 E, 192 E

[56] References Cited

U.S. PATENT DOCUMENTS

| | | | |
|---|---|---|---|
| 3,547,785 | 12/1970 | Sakuma | 204/30 |
| 3,672,940 | 6/1972 | Funada et al. | 204/30 |
| 4,172,156 | 10/1979 | Ritter et al. | 427/250 |

*Primary Examiner*—Arthur P. Demers
*Attorney, Agent, or Firm*—Robert J. Wallace

[57] ABSTRACT

A method of forming adherent electrodeposited coatings on ABS and PPO comprising the steps of etching and bonding oxygen to an ABS or PPO surface in an RF oxygen glow discharge, vacuum depositing a metal having an affinity for oxygen, and then vacuum depositing a readily electroplatable metal. Even decorative chrome electroplatings can be performed without producing blistering or peeling.

6 Claims, No Drawings

VACUUM PRETREATMENT PROCESS FOR DURABLE ELECTROPLATED COATINGS ON ABS AND PPO PLASTICS

FIELD OF THE INVENTION

This invention relates to an improved method for electroplating plastics. More specifically, it involves a pretreatment process for plastics such as acrylonitrile-butadiene-styrene (ABS) and polyphenylene oxide (PPO) for applying adherent electrodeposits, particularly decorative chromium electrodeposits.

BACKGROUND OF THE INVENTION

Plastics such as acrylonitrile-butadiene-styrene (ABS) and polyphenylene oxide (PPO) are frequently used for plastic parts in the automobile industry. In automotive applications one may want the part to be decorative chromium plated. Decorative chromium plates customarily comprise successive electrodeposited layers of copper, nickel and chromium. One does not want the layers to lose adhesion to the plastic during such electroplating or in corrosive and thermal cycling environments, such as are encountered in outdoor service and environmental testing. In order to get these layers to be durable and adhere well to plastic surfaces, the plastic surfaces have to be prepared in a very special way. This is particularly true of ABS and PPO plastic surfaces.

A typical ABS or PPO plastic surface pretreatment involves etching the plastic surface in a substance such as chromic acid. The plastic surface is then neutralized, and rinsed to remove any residual chromic acid. It is then immersed in a palladium colloid, which serves as a catalyst to trigger a subsequent electroless deposition of a thin blanket of copper or nickel onto the plastic surface. The palladium activation step is quite costly. However, it is important, in that it forms activated adhesion sites on the plastic surface. The plastic surface is then immersed in an electroless plating solution, which deposits an adherent thin metal blanket onto the plating surface. This thin layer of copper or nickel provides an adherent electrically conductive and thus readily platable coating on which to electrodeposit the decorative chrome plate.

One can appreciate that such a succession of steps is time consuming and therefore costly. It should also be appreciated that the palladium colloid is itself an expensive item in the process. Also, the safety precautions and waste disposal steps required when one works with chromic acid are quite expensive. In contrast, we have found that comparable adhesion can be obtained on ABS and PPO by a faster and less costly process. Wet chemistry process steps are avoided completely, as are the problems and costs associated with them.

OBJECTS AND SUMMARY OF THE INVENTION

It is, therefore, an object of this invention to provide an improved method of forming adherent electrodeposited coatings on the surface of acrylonitrile-butadiene-styrene (ABS) and polyphenylene oxide (PPO) plastic parts.

The invention comprehends etching an ABS or PPO plastic surface and concurrently bonding oxygen atoms to it by means of a radio frequency (RF) oxygen glow discharge. A coating of a metal having a strong affinity for oxygen is then vacuum deposited onto the etched and oxygen enhanced plastic surface. Without breaking vacuum after deposition of the first metal coating, an overcoat of a readily platable second metal, that is adherent to the first metal, is vacuum deposited onto the first metal. An adherent electrodeposited coating can then be formed on the thus prepared plastic surface. In particular, successive layers of copper, nickel and chromium can be electrodeposited onto the ABS or PPO surface without peeling or blistering during electrodeposition or subsequent normal environmental testing.

Other objects, features and advantages of this invention will become more apparent from the following description of preferred examples.

DESCRIPTION OF THE PREFERRED EMBODIMENT

In this invention we have found that an extremely adherent preplated surface can be provided on acrylonitrile-butadiene-styrene (ABS) and polyphenylene oxide (PPO) plastics by a unique process that includes an RF oxidizing glow discharge.

We recognize that many plastics present surfaces with poor adherence characteristics. We also recognize that it was previously known to increase adhesion to a plastic surface by treating that surface in an oxygen glow discharge. It previously appeared that adequate enhanced adhesion was obtained equally with either an RF or a DC oxygen glow discharge. No one suggested that an RF oxygen glow discharge produced better results on ABS or PPO. The increase in adhesion produced by either a DC or RF oxygen glow discharge may be adequate for many purposes. However, it is not adequate adhesion for an electroplating environment.

Exposure to electrolysis in a nickel and/or chromium electroplating bath is an exceptionally severe test of adhesion. Coatings that otherwise appear to have adequate adhesion will blister and/or peel during nickel and/or chromium electroplating or during subsequent environmental testing. This is true even if the plastic surface was previously treated in an RF oxygen glow discharge. The environmental testing we contemplate here includes the well known CASS test; Thermal Cycling Test for Evaluation of Electroplated Plastics—ASTM Designation B553-71; and the Standard Method of Acetic Acid-Salt Spray (FOG) Testing—ASTM Designation B287-62. On the other hand, we have found that if the plastic is ABS or PPO, and if the oxygen glow discharge is an RF glow discharge, and if the initially deposited metal is a particular vacuum deposited metal, and if the initially deposited metal is covered with platable metal without intervening exposure to ambient conditions, a readily platable plastic substrate is obtained that withstands the rigors of subsequent electroplating.

More specifically, we have found that a unique adhesion enhancement can be produced on ABS and PPO if they are first treated in an RF oxygen glow discharge and then vacuum coated with nickel. Vacuum coating the nickel with copper, without breaking vacuum, provides a platable layer adherent to the nickel layer. Then the plastic part can be electroplated in a customary copper-nickel-chromium sequence without producing any attendant blistering or peeling such as heretofore observed in all other pretreatment processes, except for the traditional wet chemistry processes on plating grade ABS and PPO plastics.

In preparing an ABS or PPO plastic part in accordance with this invention, the part is exposed to an RF oxygen plasma. The oxygen plasma can be formed in a capacitively coupled tunnel reactor at 13.56 MHz. The reactor used in our experiments had dual chambers, each of which was 10 cm in diameter. The chambers were evacuated to a pressure of about 1-2 Torr, and maintained at that pressure with a constant flow of oxygen through the chamber of about 105 cc per minute. A forward power of about 35 watts was used, with a reflective power of less than about 0.2 watts. Similar test results have been obtained with an inductively coupled tunnel reactor tested at about 50 watts forward power. Thirty-five watts forward power is preferred in order to maintain a lower plasma temperature, thereby reducing the possibility of distorting the plastic part being treated.

Once the oxygen glow discharge has been established, and part is rotated within the plasma to insure a uniform and adequate exposure. We generally expose the part to the oxygen plasma for about 3-10 minutes, preferably 8-10 minutes. The reaction which occurs appears to etch the plastic surface and leave the plastic surface very rich in oxygen, with the oxygen strongly attached to the plastic surface. At least about 3 minutes seems to be needed, to get an acceptable effect, even at high power settings. A high power setting is about 100 watts. On the other hand, etching more than about 10 minutes does not seem to provide any significant increased adhesion, unless a low power setting, i.e. below about 30 watts, is used.

We then vacuum deposit a thin film of a metal having a high affinity for oxygen onto the oxygen enriched and etched plastic surface. Metals such as nickel, chromium, titanium, molybdenum, silicon, zirconium, aluminum and alloys thereof have been used. However, nickel seems to be best. It appears that the special metal of our film not only chemically links with the oxygen but also physically interlocks with the etched surface. The metal film is deposited in a thickness sufficient to form a substantially continuous layer, i.e. a blanket coating. A thickness of at least about 100 angstroms is necessary, and perhaps 200-300 angstroms. However, we prefer to use a thickness of 500-1000 angstroms, to insure complete coverage. Greater thicknesses can be used but are costly to produce and provide no greater advantage. We have used electron beam evaporation at a pressure of about $2 \times 10^{-5}$ Torr, to deposit this initial metal film.

It should be mentioned that, if desired, one might choose to subject the plastic part to the RF oxygen glow discharge in the same apparatus one uses to deposit the metal films. This could eliminate the need to expose the part to ambient atmosphere between these two steps. This might be desirable, but it should be recognized that the initial metal film is deposited at a considerably lower pressure, i.e. higher vacuum, than used for the glow discharge. Thus a multiple vacuum chamber apparatus might be used, or one has to wait to pump down the vacuum chamber after the glow discharge treatment before starting to metallize. In any event, after the nickel film is deposited, the low pressure, i.e. high vacuum, is maintained over the nickel film and we immediately start to electron beam evaporate a blanket film of copper over the blanket nickel film. As with the nickel film, we prefer to deposit to a thickness of about 500-1000 angstroms, to insure the copper film is continuous. However, we recognize that a continuous film might be acquired with thicknesses as low at 100 angstroms. On the other hand, thicknesses greater than about 1000 angstroms should generally be avoided. They do not provide enhanced adhesion benefits and take too long to deposit. If about 1000 angstroms or less is used, the total time needed to prepare the plastic surface for electroplating is about one-half that needed for the prior art conventional wet chemistry preparation technique. We prefer to obtain the time savings. The copper serves to provide a readily platable and strongly adherent overlayer on the nickel layer. Any other metal that would serve this purpose can be used instead. However, copper is much preferred.

We believe that the nickel film should not be exposed to any significant oxygen gas pressure, particularly atmospheric pressure, before it is covered by the evaporated copper coating. Otherwise, the strong adhesive bond between these two films would be degraded. Our tests with nickel indicate that it does not make any difference whether the first film is evaporated immediately after the RF oxygen glow discharge treatment, or whether the RF oxygen glow discharge treated plastic surface is exposed to atmospheric conditions before the film is deposited. However, we presume that it would be most desirable to deposit the metal film promptly after the RF oxygen glow discharge, without breaking the vacuum, since this would provide the least opportunity for contamination of the etched plastic surface. Also, we have disclosed vacuum depositing the first and second metal films by electron beam evaporation. However, we expect that any of the other normal and accepted vacuum deposition processes could be used instead, as for example electrical resistance filament heating evaporation, induction heating vacuum evaporation, sputtering, ion plating, and the like. Also, we previously mentioned that the vacuum deposited nickel and copper films should be continuous. By this we mean continuous between any intentionally masked or shadowed areas. Also, by the term plastic, we mean a thermoplastic organic polymer, such as is hereinafter described in considerable detail.

Once the copper coating has been applied over the nickel coating, the vacuum can be released. The metal covered plastic surface is then exposed to ambient atmosphere. It can then be electroplated by any convenient technique. The technique and the metal deposited, of course, should be compatible with the copper film present as an overlayer on the plastic part. In a specific example, a successive copper, nickel and chromium layer can be electrodeposited, to comprise a decorative chrome plate on the plastic part. One might choose to electrodeposit the copper coating by first immersing the plastic workpiece prepared as previously mentioned in dilute sulfuric acid for about 10 seconds at room temperature. This helps keep the copper surface active, to improve adhesion of the subsequently applied thicker copper coating. The workpiece is then removed from the dilute sulfuric acid bath, rinsed in deionized water, and immersed in an acid copper plating bath of the following composition:

Cupric Sulfate (hydrated): 22-26 oz./gal.
Sulfuric Acid (concentrated): 8 oz./gal.
Thiourea: 0.000589 oz./gal.
Sodium Lauryl Sulfate: 0.00566 oz./gal.
Molasses: 0.25 ml./liter The bath is maintained at a temperature of about 70°-90° F. With air and cathode rod agitation, a negative potential is applied to the workpiece to establish a cathode current density of about 50 amperes per square foot for a sufficient duration to electrodeposit a copper coating of about 5–10 micrometers onto the vacuum deposited copper coating. The workpiece is then removed from the copper plating bath, rinsed in deionized water, and immediately immersed in a bath for electrodepositing a bright nickel coating. One such bath which can be used has the following composition:

Nickel Sulfate (hydrated): 30–50 oz./gal.
Nickel Chloride (hydrated): 4–10 oz./gal.
Boric Acid: 5–8 oz./gal.
Wetting Agent: 0.00566 oz./gal.
Primary Brightener: 0.2–5 grams/liter
Secondary Brightener: 2–100 mg./liter A negative potential is applied to the workpiece, along with cathode rod agitation, for a sufficient duration to deposit a nickel coating of about 20 micrometers onto the workpiece. The bath is preferably maintained at a temperature of about 120°–150° F. Cathode current density is maintained at approximately 40–60 amperes per square foot during plating.

When a sufficient thickness of nickel has been deposited onto the workpiece, it is removed from the nickel electroplating bath, rinsed in deionized water, and placed directly in contact with a suitable chromium plating solution. One chromium coating that can be used is the dual layer coating disclosed in U.S. Pat. No. 3,157,585 Durham. It involves depositing an initial chromium layer from a bath containing about 40 ounces per gallon chromium trioxide and 0.4 ounces per gallon sulfuric acid. While the workpiece is immersed in such a bath the chromium layer is deposited at a cathode current density of approximately 140 amperes per square foot while the bath is maintained at a temperature of approximately 120° F. In about 5 minutes a minimum coating thickness of at least about 0.25 $\mu$m is deposited. The part is then rinsed in deionized water and immersed in a second chromium plating bath of the following composition:

Chromium Trioxide: 26.0 oz./gal.
Potassium Dichromate: 4.0 oz./gal.
Strontium Chromate: 0.6 oz./gal.
Potassium Silicofluoride ($K_2SiF_6$): 1.4 oz./gal.
Strontium Sulfate: 0.8 oz./gal.

The workpiece is electrolyzed at a cathode current density of approximately 125 amperes per square foot for a sufficient duration to obtain a minimum coating thickness of about 0.25 micrometers. After an adequate thickness of the second chromium layer has been deposited, the workpiece can be removed from the chromium plating solution, rinsed and dried, whereupon it is ready for use. It should be appreciated that plating bath compositions and electrodeposition conditions other than the foregoing can be used. We choose to use the ones hereinbefore described only to emphasize the strong adhesion achievable on ABS and PPO with this invention.

We previously described that the part would be rotated within the oxygen glow discharge to obtain most uniform and adequate exposure. However, if the effect of the plasma is sufficiently uniform due to appropriate design of the plasma electrode, or if the surface does not have any particularly complex curvatures, rotation may not be necessary. Analogously rotation of even a complexly curved part during vacuum deposition may not be necessary if multiple deposition sources are used. Also, while we describe a tunnel reactor, it is not necessary that the reactor be of the tunnel type. Any plasma reactor can be used. However, we would obviously prefer a commercially available apparatus, particularly for commercial production conditions. Still further, it is to be understood that we would prefer a single apparatus which would permit one to maintain a vacuum constantly over the surface of the plastic part from the time it is exposed to the oxygen plasma through the time that it is vacuum coated with copper.

As previously indicated, we have found an improved technique for forming electroplated deposits on plastics such as acrylonitrile-butadiene-styrene (ABS) and polyphenylene oxide (PPO). ABS is a terpolymer that is obtained by initially copolymerizing acrylonitrile and styrene, and grafting the copolymerized acrylonitrile and styrene onto particles of polybutadiene, a synthetic rubber. The grafting is performed by copolymerizing the acrylonitrile and the styrene in the presence of particles of polybutadiene rubber. One can generally consider ABS as a thermoplastic polymer having identifiable particles of polybutadiene rubber dispersed in it. The polybutadiene rubber particles make it difficult to get good adhesion to an ABS surface. ABS is obtained from Borg-Warner under the name Cycolac, from Monsanto under the name Lustran, from Dow under the name Abtec, from Rexene Styrenics under the name Rexene, and from the Carl Gordan Company under its generic name. There are a variety of ABS grades available, with wide ranges in impact strengths, bend distortion temperatures, and tensile strengths. ABS can be considered a blend of a glassy polymer in a rubbery domain. The proportions of acrylonitrile, styrene and polybutadiene can vary widely from grade to grade. These grades can be pure ABS, modified, or mixtures of pure ABS with other substances. We intend to include all such substances by the term ABS. We intend to use our invention on the plating grades of ABS most of all.

Polyphenylene oxide is in fact poly (2,6-dimethyl-1,4-phenylene ether). It is a linear polymer having a molecular weight of about 25,000–30,000. It is available from the General Electric Company under the names PPO and Noryl. We intend to include all grades of polyphenylene oxide (ether) in the term PPO, whether it is the pure polymer, a modified polymer, a copolymer, or the like. This invention may provide enhanced adhesion on other polymers which have not yet been studied. Further, the nickel-copper metallization described herein does not work for mineral-filled nylon. However, enhanced adhesion on the mineral-filled nylon is obtained if the RF glow discharge-treated part is metallized first with a film of chromium, and then successive nickel and copper films, without intervening exposure to air during the metallization.

The embodiments of the invention in which an exclusive property or privilege is claimed are defined as follows:

1. A method of forming adherent electrodeposited coatings onto a surface of a thermoplastic polymer selected from the class consisting of ABS and PPO comprising the steps of exposing the polymer surface to an RF oxidizing glow discharge equivalent to at least about 3 minutes at a power setting of at least about 50 watts, vacuum depositing onto the so-exposed surface a first thin film of a metal selected from the class consisting of nickel, chromium, titanium, molybdenum, silicon, zirconium, aluminum and alloys thereof to form a blanket metal layer strongly bonded to the so-exposed surface, vacuum depositing a blanket thin film of a readily electroplatable metal strongly bonded to the first thin film, and then electrodepositing an overlayer onto the last-mentioned vacuum deposited thin film, without producing peeling or blistering of the films or the overlayer on them.

2. A method of forming an adherent electrodeposited coating onto a surface of a thermoplastic polymer selected from the class consisting of ABS and PPO comprising establishing a vacuum over the polymer surface and successively exposing the polymer surface to an RF oxidizing glow discharge equivalent to at least about 3 minutes at a power setting of at least about 50 watts, vacuum depositing a continuous nickel film onto the co-exposed surface, and vacuum depositing a blanket thin film of copper onto the nickel thin film, exposing the film covered surface to atmospheric air, and then electrodepositing successive layers of copper, nickel and chromium onto the vacuum deposited films without producing peeling or blistering of the films or the overlayers on them.

3. A method of forming adherent electrodeposited coatings on a surface of a thermoplastic polymer selected from the class consisting of ABS and PPO without using liquid process steps for pretreatment of the polymer surface comprising the steps of activating and etching the polymer surface in an oxidizing RF glow discharge equivalent to an Rf oxygen glow discharge at a pressure of about 1-2 Torr for about 3-10 minutes at a power setting of about 35-150 watts, vacuum depositing a first coating of a first metal selected from the class consisting of nickel, chromium, titanium, molybdenum, silicon, zirconium, aluminum and alloys thereof to form a first metal layer highly adherent to the activated and etched plastic surface, vacuum depositing onto the first metal layer a coating of a readily electroplatable metal that is highly adherent to the first metal layer, and then electrodepositing at least one subsequent metal layer onto the second vacuum deposited metal layer without producing peeling or blistering of the first or second metal layers.

4. A method of forming an adherent electrodeposited coating onto a surface of a plastic selected from the class consisting of ABS and PPO polyphenylene oxide mixtures thereof performing the following steps on the plastic surface while continuously maintaining a vacuum over the plastic surface, treating the plastic surface in an RF oxygen glow discharge equivalent to treatment for about 3-10 minutes at a pressure of about 1-2 Torr at a power setting of about 35-150 watts, vacuum depositing a first coating of nickel and alloys thereof onto said surface to form a first metal layer strongly bonded to the plastic surface, and vacuum depositing a coating of copper onto the first metal layer to form a strongly bonded readily electroplatable metal coating on the first metal layer, thereafter exposing the thus coated plastic surface to ambient atmospheric conditions and electrodepositing successive layers of copper and nickel onto the vacuum deposited copper layer.

5. A method of forming an adherent base coating on a surface of a polymer selected from the class of ABS and PPO, which coating is not only readily electroplatable but is also resistant to blistering and peeling during electroplating metal overlayers onto them, comprising the steps of etching the polymer surface and bonding oxygen atoms thereto in an RF oxygen glow discharge, vacuum depositing a coating onto the etched oxygen bonded polymer surface of a metal having a strong affinity for oxygen, and without breaking vacuum after depositing the aforesaid metal coating, vacuum depositing an overlayer of a readily electroplatable metal onto the metal having a strong affinity for oxygen.

6. A method of forming an adherent base coating on a surface of an acrylonitrile-butadiene-styrene polymer, which coating is not only readily electroplatable but is also resistant to blistering and peeling during electroplating conditions, comprising the steps of etching the polymer surface and bonding oxygen atoms thereto in an RF oxygen glow discharge, vacuum depositing a nickel coating onto the etched and oxygen bonded polymer surface, and without breaking vacuum after depositing the nickel coating, vacuum depositing an overlayer of copper onto the nickel coating.

* * * * *